(12) United States Patent
Sinning et al.

(10) Patent No.: US 10,896,864 B2
(45) Date of Patent: Jan. 19, 2021

(54) POWER SEMICONDUCTOR CHIP MODULE

(71) Applicant: HS Elektronik Systeme GmbH, Nördlingen (DE)

(72) Inventors: Richard Sinning, Schnelldorf (DE); Bernd Loefflad, Nordlingen-Lopsingen (DE); Markus Greither, Augsburg (DE); Peter Brantl, Fremdingen (DE); Josef Maier, Munningen (DE); Rainer Seidel, Tussenhausen (DE)

(73) Assignee: HS ELEKTRONIK SYSTEM GMBH, Nordlingen (DE)

( * ) Notice: Subject to any disclaimer, the term of this patent is extended or adjusted under 35 U.S.C. 154(b) by 0 days.

(21) Appl. No.: 15/964,128

(22) Filed: Apr. 27, 2018

(65) Prior Publication Data

US 2018/0350715 A1 Dec. 6, 2018

(30) Foreign Application Priority Data

Jun. 1, 2017 (EP) .................................... 17173991

(51) Int. Cl.
*H01L 23/373* (2006.01)
*H01L 25/16* (2006.01)
(Continued)

(52) U.S. Cl.
CPC ...... *H01L 23/3735* (2013.01); *H01L 23/4334* (2013.01); *H01L 23/467* (2013.01); *H01L 23/62* (2013.01); *H01L 25/071* (2013.01); *H01L 25/074* (2013.01); *H01L 25/117* (2013.01); *H01L 25/16* (2013.01); *H01L 23/367* (2013.01); *H01L 24/48* (2013.01); *H01L 2224/29111* (2013.01); *H01L 2224/29139* (2013.01); *H01L 2224/29144* (2013.01); *H01L 2224/29147* (2013.01); *H01L 2224/48091* (2013.01); *H01L 2224/48227* (2013.01); *H01L 2924/1033* (2013.01); *H01L 2924/10253* (2013.01); *H01L 2924/10272* (2013.01); *H01L 2924/12032* (2013.01); *H01L 2924/1301* (2013.01); *H01L 2924/13055* (2013.01);
(Continued)

(58) Field of Classification Search
CPC .......................... H01L 23/3735; H01L 23/467
USPC ........................................................ 257/690
See application file for complete search history.

(56) References Cited

U.S. PATENT DOCUMENTS 6,707,141 B2 3/2004 Akram
6,858,922 B2 * 2/2005 Pavier ............... H01L 23/49575
257/670

(Continued)

OTHER PUBLICATIONS

Extended European Search Report for International Application No. 17173991.5 dated Dec. 12, 2017, 7 pages.

*Primary Examiner* — Mohammad M Hoque
(74) *Attorney, Agent, or Firm* — Cantor Colburn LLP

(57) ABSTRACT

The present invention relates to a power semiconductor chip module, comprising a substrate having a top side and a bottom side; at least one first power semiconductor device attached to the top side of the substrate; at least one first conductive structure thermally and electrically connecting the first power semiconductor device to the top side of the substrate; at least one second power semiconductor device attached to the bottom side of the substrate; and at least one second conductive structure connecting the second power semiconductor device to the bottom side of the substrate.

12 Claims, 2 Drawing Sheets

(51) Int. Cl.
    *H01L 25/11*     (2006.01)
    *H01L 23/62*     (2006.01)
    *H01L 25/07*     (2006.01)
    *H01L 23/433*     (2006.01)
    *H01L 23/467*     (2006.01)
    *H01L 23/00*     (2006.01)
    *H01L 23/367*     (2006.01)

(52) U.S. Cl.
    CPC .............. *H01L 2924/13091* (2013.01); *H01L 2924/19105* (2013.01); *H01L 2924/19106* (2013.01); *H01L 2924/19107* (2013.01)

(56) References Cited

U.S. PATENT DOCUMENTS

| | | | |
|---|---|---|---|
| 6,927,485 B2* | 8/2005 | Lai | H01L 23/49816 257/686 |
| 8,754,517 B2 | 6/2014 | Kim et al. | |
| 2004/0113275 A1* | 6/2004 | Karnezos | H01L 21/563 257/758 |
| 2006/0255362 A1* | 11/2006 | Otremba | H01L 23/4952 257/177 |
| 2011/0057713 A1* | 3/2011 | Kawanami | H01L 23/642 327/427 |
| 2012/0061775 A1* | 3/2012 | Kim | B60C 23/0408 257/415 |
| 2012/0074586 A1* | 3/2012 | Seo | H01L 23/49816 257/774 |
| 2012/0307541 A1* | 12/2012 | Shimoike | H01L 24/29 363/132 |
| 2013/0200673 A1 | 8/2013 | Middendorf | |
| 2013/0220673 A1* | 8/2013 | Middendorf | H01L 24/43 174/250 |
| 2015/0223320 A1 | 8/2015 | Gerhäuβer | |
| 2016/0358837 A1* | 12/2016 | Liang | H01L 21/565 |
| 2017/0064808 A1* | 3/2017 | Rizza | H01L 23/24 |
| 2017/0263527 A1* | 9/2017 | Mohn | H01L 23/49838 |

* cited by examiner

POWER SEMICONDUCTOR CHIP MODULE

FOREIGN PRIORITY

This application claims priority to European Patent Application No. 17173991.5 filed Jun. 1, 2017, the entire contents of which is incorporated herein by reference.

TECHNICAL FIELD

The present invention relates to a power semiconductor chip module. Such power semiconductor chip modules may be suitable for use in power distribution and conversion in a vehicle, in particular in an aircraft.

BACKGROUND

Power semiconductor chip modules are devices for switching, converting and controlling the flow of electric energy and are used as inverters, DC/DC converters, and other power switching devices. Power semiconductor chip modules are widely used in homes, industries, automobiles, aircraft, wherever power must be converted, distributed, and controlled. Power semiconductor devices, including diodes, thyristors, power MOSFETS and IGBTs, are typically assembled to form power semiconductor chip modules, which may contain a plurality of such power semiconductor devices.

Switching, controlling and converting power in power semiconductor devices of the type described above produces significant heat. In applications like SSPCs heat is usually generated when switching a power semiconductor device. This heat will increase the temperature of the power semiconductor chip module to the point of failure of the power semiconductor devices. Therefore, efficient heat management is a main requirement for electrical equipment using power semiconductor devices of this type.

Conventionally, a plurality of power semiconductor devices are connected in parallel to share load requirements and keep the amount of heat generated when switching individual power semiconductor devices below critical thresholds. However, this requires a large number of power semiconductor devices on a printed circuit board, thus increasing space requirements and limiting power density.

Therefore, it would be beneficial to have an improved configuration for a power semiconductor module allowing more efficient assembly and/or better utilization of space while still providing sufficient heat dissipation capability.

SUMMARY

One aspect relates to a power semiconductor chip module comprising a substrate having a top side and a bottom side; at least one first power semiconductor device attached to the top side of the substrate; at least one first conductive structure thermally and electrically connecting the first power semiconductor device to the top side of the substrate; at least one second power semiconductor device attached to the bottom side of the substrate; and at least one second conductive structure connecting the second power semiconductor device to the bottom side of the substrate.

The first power semiconductor device and/or the second power semiconductor device particularly may be a power semiconductor die. More particularly, the first power semiconductor device and/or the second power semiconductor device may be a bare or naked power semiconductor die mounted to a circuit board, e.g. by Chip-on-Board technology.

The power semiconductor chip module may comprise a plurality of first power semiconductor devices mounted to the top side of the substrate, as described herein, and a plurality of second power semiconductor devices mounted to the bottom side of the substrate as described herein.

BRIEF DESCRIPTION OF THE DRAWINGS

Another aspect relates to a solid state power controller, particularly for an aircraft, comprising a plurality of power semiconductor chip modules as described herein.

The invention will be described in more detail in the following with respect to the accompanying figures.

DETAILED DESCRIPTION

Figure 1:
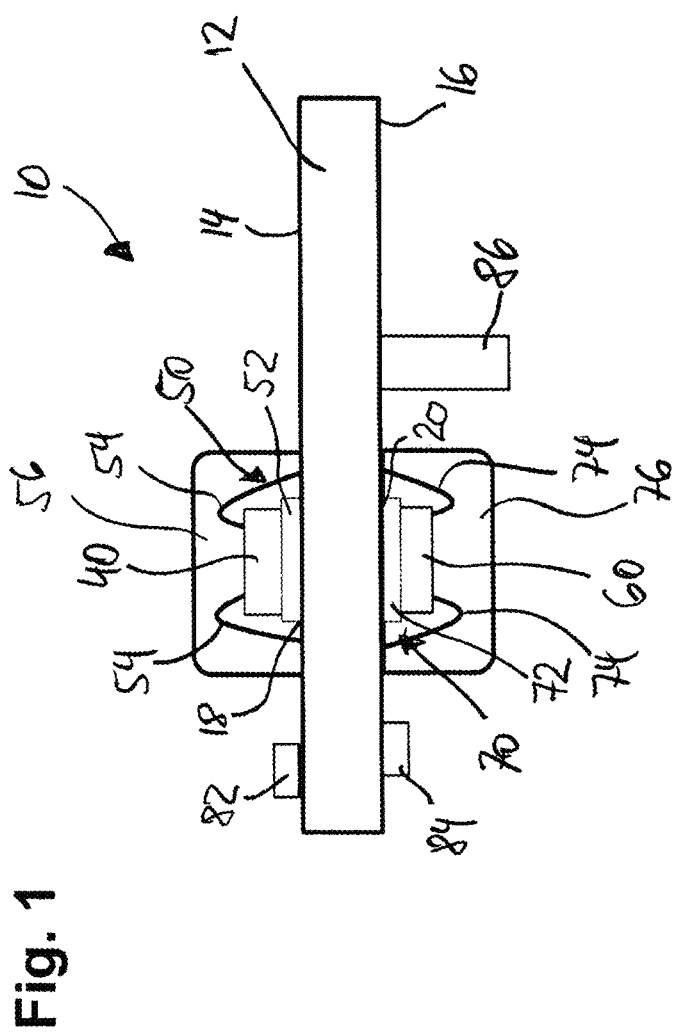
FIG. 1 shows a schematic cross sectional view of a power semiconductor chip module according to an embodiment.

In the following detailed description, a number of specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semidiagrammatic and not to scale and, particularly, some of the dimensions are for the clarity of presentation and are shown greatly exaggerated in the drawing figures. Where multiple embodiments are disclosed and described, having some features in common, for clarity and ease of illustration, description, and comprehension thereof, similar and like features one to another will ordinarily be described with like reference numerals. Such features will only be described with respect to the first figure in which the respective feature occurs. The same description applies with respect to the same features in other figures.

The term "horizontal" as used herein is defined as a plane parallel to the conventional plane or surface of the package top, regardless of its orientation. The term "vertical" refers to a direction perpendicular to the horizontal as just defined. Terms, such as "on", "above", "below", "bottom", "top", "side", "higher", "lower", "upper", "over", and "under", are defined with respect to the horizontal plane.

FIG. 1 is a cross-sectional view of a first embodiment of a power semiconductor chip module 10 according to an embodiment.

The power semiconductor chip module 10 comprises a substrate 12 having a top side 14 and a bottom side 16 provided with top contact pads and bottom contact pads, respectively. The top contact pads may be electrically connected to corresponding bottom contact pads, where appropriate. At least one first power semiconductor device 40, in particular a power semiconductor switch, is attached to the top side 14 of the substrate 12. At least one second power semiconductor device 60, in particular a power semiconductor switch, is attached to the bottom side 16 of the substrate 12. In particular, both the first power semiconductor device 40 and the second power semiconductor device 60 are provided as bare semiconductor dies, i.e. "naked" semiconductor chips, and attached to the top side 14 and the bottom side 16, respectively, using Chip-on-Board technology. Thus, the semiconductor chips or dies of the first and second power semiconductor devices 40, 60 have a configuration as after dicing from a larger waver, but without applying any packaging or leads. The power semiconductor devices 40, 60 may be provided with a metallization, e.g. in the configuration of Al or NiAg surface, as back-end treatment. Particularly, the semiconductor chips or dies are not provided with any lead frame or similar structure on the chip or die to electric leads for connecting to a socket or SMD pads of a printed circuit board. As used herein, the term SMD refers to a surface mounted device. Instead of such lead frame structures, conductive structures 50, 70 are used to connect the power semiconductor devices 40, 60 to corresponding contact pads on the top side 14 and bottom side 16 of the substrate 12, respectively. Thus, the power semiconductor module 10 provides a leadless package having power semiconductor devices 40, 60 connected to both the top side 14v and bottom side 16 of the substrate 12, e.g. as Chip-on-Board devices.

The power semiconductor devices 40, 60 may include semiconductor switches, including at least one of an insulated gate bipolar transistor (IGBT), a metal-oxide semiconductor field effect transistor (MOSFET), or a thyristor. Other power semiconductor devices like Schottky diodes, power diodes, capacitors, resistors may be provided in combination with power semiconductor switches. In particular, the power semiconductor devices 40, 60 may be integrated circuits (also referred to as semiconductor chip or die) comprising any combination of these power semiconductor devices on a semiconductor die formed in semiconductor technology, e.g. using CMOS technology. The power semiconductor device may be made in a number of semiconductor die technologies, e.g. Si, GaN, SiC.

In the embodiment of FIG. 1, a first conductive structure 50 and a second conductive structure 70 are provided in the power semiconductor chip module 10. Each of these conductive structures 50, 70 connects the respective power semiconductor device 40. 60 to a respective group of corresponding contact pads 18, 20 provided on the top side 14 of the substrate 12 and on the bottom side 16 of the substrate 12, respectively. In FIG. 1, the conductive structure 50 connects contact pads on the bottom side of the first power semiconductor device 40 to contact pads 18 on the top side 14 of the substrate 12. The conductive structure 70 connects contact pads on the bottom side of the second power semiconductor device 60 to contact pads 20 on the bottom side 16 of the substrate 12.

Throughout this disclosure, the terms "heat" and "thermal energy" are used as synonyms. As used herein a structure is considered conductive in case the structure has both electrically conductive and thermally conductive characteristics.

Each of the conductive structures 50, 70 comprises a respective conductive contact layer 52, 72. The first conductive contact layer 52 connects corresponding contact pads on the bottom surface of the semiconductor die in which the first power semiconductor device 40 is formed, to contact pads 18 on the top side 14 of the substrate 12. The second conductive contact layer 72 connects corresponding contact pads on the bottom surface of the semiconductor die in which the second power semiconductor device 60 is formed, to contact pads 20 on the bottom side 16 of the substrate 12. Each of the conductive contact layers 52, 72 has a sufficiently large thermal capacity to buffer thermal energy produced in a single switching cycle of the power semiconductor devices 40, 60. The conductive contact layers 52, 72 may be made of any suitable electrically conductive material having a thermal conductivity and thermal capacity as large as required. E.g. the conductive contact layers 52, 72, may be made of copper, silver, gold, tin, molybdenum, aluminum, or any suitable alloy of these materials (e.g. copper invar composites). Copper is a particularly well suited material. In addition to being electrically conductive and having a relatively large thermal capacity, such structures may be also very efficient with respect to transport of heat by thermal conduction. The conductive contact layers act as a heat sinks with respect to thermal energy produced by the first and second power semiconductor devices 40, 60 in the course of a switching cycle. The large thermal capacity of the conductive contact layers 52, 72, provides for a buffer for temporarily taking up thermal energy produced in the course of a switching cycle. The thermal conductivity of the conductive contact layers 52, 72, together with their respective connections to the contact pads on the respective semiconductor die and substrate surface provides for an efficient path for transporting thermal energy from the power semiconductor devices 40, 60 towards a heat sink, e.g. a printed circuit board forming the substrate 12, or to a printed circuit board to which the power semiconductor chip module 10 is mounted, or to a cooling structure mounted to the power semiconductor chip module 10. The disclosed configuration with power semiconductor chip modules mounted on both sides of a substrate 12 provides for efficient heat management. Thus, the power semiconductor devices 40, 60 in such configuration may be less over-dimensioned, and hence the number of required power semiconductor devices or power semiconductor dies may be reduced.

Each of the conductive structures 50, 70 has a contact region forming a respective conductive contact layer 52, 72 in contact with an adjacent side of the respective power semiconductor device 40, 60, and in contact with the respective top side 14 or bottom side 16 of the substrate 12. The conductive contact layer 52 of the first conductive structure 50 is in contact with the bottom side of the semiconductor die of the first power semiconductor device 50, and is in contact with the top side of the substrate 12. The conductive contact layer 72 of the second conductive structure 70 is in contact with the bottom side of the semiconductor die of the second power semiconductor device 60, and is in contact with the bottom side of the substrate 12.

As indicated in FIG. 1, the conductive contact layers 52, 72 are in contact with the power semiconductor device 40, 60 over a substantial contact area. The contact area may cover the bottom side or top side of the respective power semiconductor chip or die of the power semiconductor devices 40, 60.

As the conductive contact layers 52, 72 are in direct contact with the respective contact pads of the power semiconductor chip or die of the power semiconductor devices 40, 60, the conductive contact layers 52, 72 can take up thermal energy very quickly and thus act as thermal buffers with respect to pulsed thermal energy produced during switching cycles of the power semiconductor device 40, 60. Moreover, the conductive contact layers 52, 72 have a large thermal conductivity and thus efficiently transport heat away from the power semiconductor devices 40, 60.

In order to provide a sufficiently large thermal capacity, the each of the conductive contact layers 52, 72 is relatively thick and made of a material having a high thermal conductivity. Each of the conductive contact layers 52, 72 has a thickness of at least 35 µm. In some embodiments, the thickness of the conductive contact layers 52, 72 may be even larger, e.g. 70 µm or more, or even 100 µm or more. A suitable material for the conductive contact layers 52, 72 is copper.

In order to further enhance the thermal conductivity of the first and second conductive contact layers 52, 72, each of the first and second conductive contact layers 52, 72 is formed e.g. by soldering in such a way that a relatively void free soldering structure is obtained. One suitable technique for forming the first and second conductive contact layers 52, 72 is vapor phase soldering. The soldering structures obtained for the first and second conductive contact layers 52, 72 may have a void content of 25% or less, typically of 10% or less.

In addition to the first and second conductive contact layers 52, 72, the first and second conductive structures 50, 70 also include wire bonds 54, 74 connecting an opposite side of the power semiconductor dies of the first and second power semiconductor devices 40, 60 to corresponding contact pads 18, 20 on the top side of the substrate 12 or on the bottom side of the substrate 12. These wire bonds 54, 74 have the configuration of heavy wire bonds formed with wires having wire diameters of at least 100 µm, or particularly with wires having wire diameters between 300 µm and 500 µm.

The first power semiconductor device 40 including the first conductive structure 50 is embedded in a potting 56 made from an electrically isolating material, e.g. in the configuration of a globtop. Also, the second power semiconductor device 60 including the second conductive structure 70 is embedded in a potting 76 made from an electrically isolating material, e.g. in the configuration of a globtop.

In addition to the first and second power semiconductor devices 40, 60, further electrical components 82, 84, 86 are attached to both sides of the substrate 12. Such devices may be further passive components, like resistors or capacitors, or may be more complex integrated circuit devices, e.g. in the configuration of SMD devices.

Figure 2:
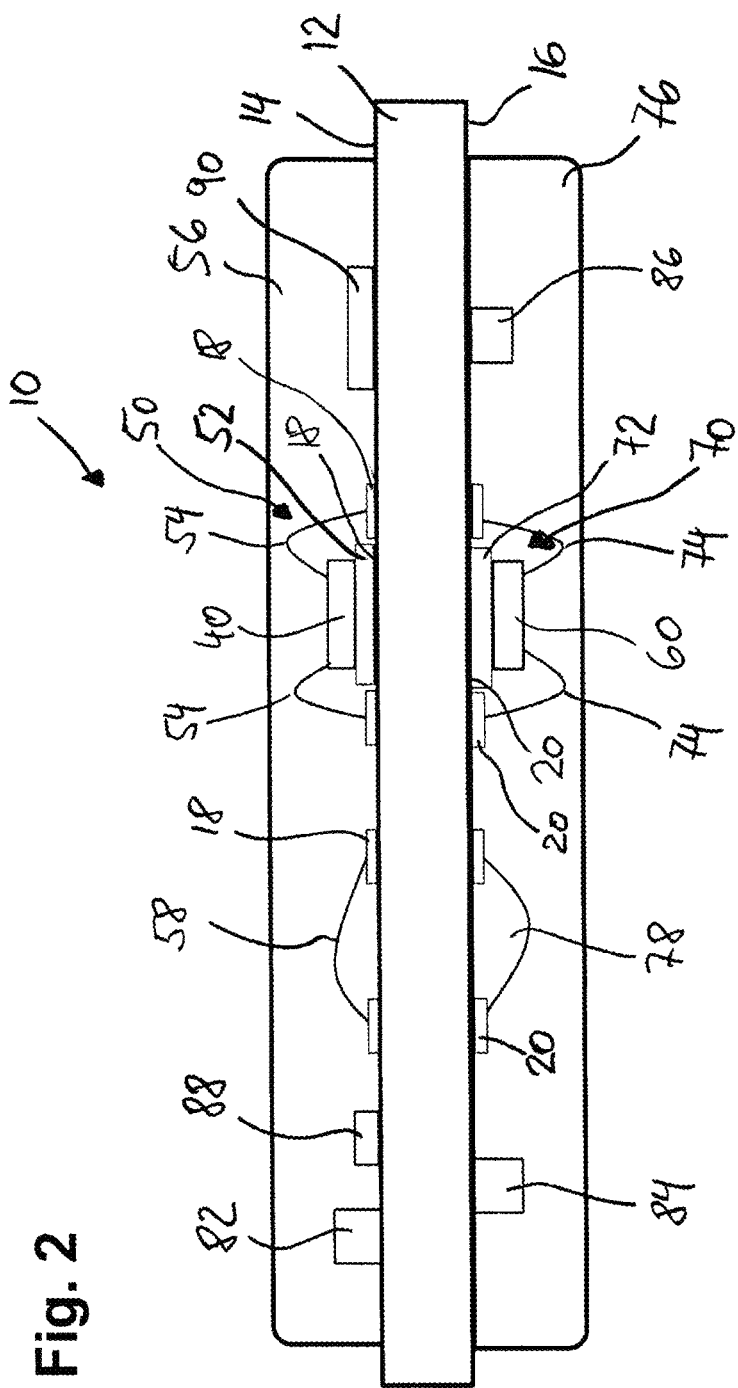
FIG. 2 shows a schematic cross sectional view of a further power semiconductor chip module including other devices according to an embodiment.

The embodiment of a power semiconductor chip module 10 shown in FIG. 2 corresponds to FIG. 1. Therefore, the same reference numerals are used in FIG. 2 as in FIG. 1 to denote like components of the power semiconductor module 10. To avoid duplication, reference is made to the description of these components with respect to FIG. 1. In the following, additional components, or differences, with respect to the embodiment of FIG. 1 are described.

In the power semiconductor chip module 10 of FIG. 2, potting 56 encloses the first power semiconductor device 40 including the first conductive structure 50 and also a number of further electrical components 58, 82, 88, 90 attached to the top side of the substrate 12. The potting 56 is made from an electrically isolating material, e.g. in the configuration of a globtop. Similarly, the potting 76 encloses the second power semiconductor device 60 including the second conductive structure 50 and also a number of further electrical components 78, 84, 86 attached to the bottom side of the substrate 12. The potting 76 is made from an electrically isolating material, e.g. in the configuration of a globtop. Particularly, the components 90, 86 may include control circuits for controlling operation of the power semiconductor devices 40, 60, e.g. gate drive control circuits for a power switch included in the power semiconductor devices 40, 60. The components 90, 86 including the control circuit may be in the form of integrated circuits. The components 90, 86 may be SMD devices.

In addition, respective wire connections or fuses 58, 78 are attached to both sides of the substrate 12. A first wire connection 58 is attached to the top side 14 and embedded in the same globtop cover as the first power semiconductor device 40. A second wire connection 78 is attached to the bottom side 16 and embedded in the same globtop cover as the second power semiconductor device 60.

The embodiments described provide an improved configuration for a power semiconductor chip module allowing more efficient assembly and/or better utilization of space while still providing sufficient heat dissipation capability.

Increase of power density may be achieved by placing power semiconductor chips on both sides of a common substrates using Chip-on-Board technology. Hence, more power semiconductor devices, particularly power semiconductor switches, may be placed on a substrate, e.g. a printed circuit board (PCB), of a given size. The semiconductor chip module comprises a substrate having a top side and a bottom side provided with top and bottom contact pads. The top contact pads of the substrate are used for electrically connecting the first power semiconductor device, and also for providing heat management to the first power semiconductor device. The bottom contact pads of the substrate are used for electrically connecting the second power semiconductor device, and also for providing heat management to the second power semiconductor device. Thus, the power semiconductor chip modules can provide a larger density of power semiconductor devices per area.

The power semiconductor device may be a bare semiconductor die, i.e. a "naked" semiconductor chip. A semiconductor chip or die is an electrical power component or integrated circuit build up on a semiconductor wafer, e.g. using MOSFET, IGBT, CMOS or other technology for constructing integrated circuits based on semiconductor wafers. The expression "bare" or "naked" is to be understood in the sense that the semiconductor chip or die is in a state after dicing from a larger wafer, but without applying any packaging. Particularly, the semiconductor chip or die is not provided with any lead frame or similar structure for bonding contact pads on the chip or die to electric leads for connecting to a socket or a printed circuit board. Instead of such structures, a conductive structure is used to connect the power semiconductor device to respective bonding pads on the top side or bottom side of the substrate. Thus, the power semiconductor module provides a leadless package, and does not include any lead frames, or similar structures.

Particular examples for power semiconductor devices include semiconductor switches, including at least one of an insulated gate bipolar transistor (IGBT), a metal-oxide semiconductor field effect transistor (MOSFET), or a thyristor. Other power semiconductor devices like Schottky diodes, power diodes, capacitors, resistors may be provided in combination with power semiconductor switches. In particular, the power semiconductor device may be an integrated circuit comprising any combination of these power semiconductor devices on a semiconductor die formed in semiconductor technology, e.g. using CMOS technology. The integrated circuit may include e.g. bridge circuits as used for power converters and/or power inverters, operating amplifier circuits, or other integrated circuits.

The power semiconductor device may be made in a number of semiconductor die technologies, e.g. Si, GaN, SiC. Power semiconductor devices used in typical applications like aircraft power conversion typically are based on silicon carbide SiC which has better thermal characteristics than mere silicon based power devices. SiC based power devices may operate up to temperatures as high as 250° C. and produce less heat than corresponding silicon based devices. However, even for SiC based power devices efficient transfer of heat away from the semiconductor device is a main requirement.

Each of the first and second power semiconductor devices may have a current rating of at least 1 A. Thus, each of the first and second power semiconductor devices will be configured to sustain or switch electric currents of 2 A, or more. The power semiconductor module is particularly configured to manage heat produced when switching electric currents of 1 A, or more.

Further, each of the first and second power semiconductor devices may be configured for high voltage applications. Particularly, each of the first and second power semiconductor devices may have a voltage rating of at least 18V DC or AC. Thus, each of the first and second power semiconductor devices may be configured to sustain or switch DC or AC voltages of at least 18 V.

At least one conductive structure is provided on either side of the substrate. The at least one conductive structure connects the respective first or second power semiconductor device to the substrate. For example, the contact may be provided on the top side of the substrate, particularly in case the conductive structure is connected to a contact pad on the bottom side of the semiconductor die carrying the power semiconductor device. Correspondingly, the contact may be provided on the bottom side of the substrate, particularly in case the conductive structure is connected to a contact pad on the top side of the semiconductor die carrying the power semiconductor device.

Particularly for power switching devices production of heat is normally associated with switching cycles of the power switching device. Power switching devices normally produce a significant amount of heat for a short time period associated with a switching cycle of the power switching device from ON to OFF or from OFF to ON. During other time periods of operation, such power switching devices do produce less heat. Therefore, normally a power switching device must be configured such as to withstand the heat produced in the course of a switching cycle and thus is over-dimensioned when considering the average amount of heat produced. In the power semiconductor chip module disclosed herein, the at least one conductive structure is configured in such a way that a thermal capacity of the conductive structure is sufficiently large to take up an amount of heat generated during a switching cycle of the at least one power semiconductor device with only a moderate, increase in temperature as a result of the switching cycle, and transport the heat away towards the substrate until the next switching cycle commences. Thus, the increase in temperature of the power semiconductor chip module resulting from a switching cycle never exceeds a critical threshold. Thermal energy produced in a single switching cycle may be buffered by the conductive structure.

As used herein a structure is considered conductive in case the structure has both electrically conductive and thermally conductive characteristics.

Compared to known technologies the embodiments described herein allow a further improvement in space utilization by attaching power semiconductor chip modules to both sides of a common substrate, e.g. a printed circuit board. This allows to utilise the available space on the mounting surfaces of the printed circuit board more efficiently. In addition, heat management may even be improved, since short term heat fluctuations due to switching cycles of individual power semiconductor switches may be buffered by the respective conductive structure having a large thermal capacity, and the buffered thermal energy may be efficiently transported away (i.e. to the printed circuit board) over a longer time period in between successive switching cycles of the respective power semiconductor device.

This disclosure shows that sufficient heat dissipation can be realized by contacting conductive contact layers having a sufficiently large thermal capacity to the bare semiconductor die in which the power switching device is formed. The conductive contact layers may be made of any suitable electrically conductive material having a thermal capacity as large as possible. E.g. the conductive structures may be made of copper, silver, gold, tin, molybdenum, aluminum, or any suitable alloy of these materials (e.g. copper invar composites). Copper is a particularly well suited material. In addition to being electrically conductive and having a relatively large thermal capacity, such structures may be also very efficient with respect to transport of heat, and may be thermally connected to the respective contact pads at the upper and/or lower sides of the module body. In this way, the conductive structure acts as a heat sink with respect to heat produced by the power semiconductor device in the course of a switching cycle. The large thermal capacity of the conductive structure provides for a buffer for temporarily taking up thermal energy produced in the course of a switching cycle. The thermal conductivity of the conductive structure together with its connection to the contact pads provides for an efficient path for transporting thermal energy from the power semiconductor chip module to a heat sink, e.g. the substrate or a cooling structure mounted to the substrate.

In particular embodiments, any of the following optional features may be realized. It goes without saying that any of these features may be realized in isolation or may be realized in connection with other features:

The first conductive structure may connect a bottom side of the first power semiconductor device to a top contact pad on the top side of the substrate. The second conductive structure may connect a bottom side of the second power semiconductor device to a bottom contact pad on the bottom side of the substrate. In embodiments where the power semiconductor device is a power semiconductor switch, the first and second conductive structures may each comprise a first contact layer connecting a drain of the first and second power semiconductor devices, respectively, to the substrate. The first and second contact structures may each also comprise a second contact layer connecting a source of the first and second power semiconductor devices, respectively, to the substrate. Typically, wire bonds may connect the source of the first and second power semiconductor devices to the substrate. The first and second contact structures may each also comprise a third contact layer connecting a gate of the first and second power semiconductor devices, respectively, to the substrate. Typically, wire bonds may connect the gate of the first and second power semiconductor devices to the substrate.

In further embodiment of the power semiconductor chip module the at least one conductive structure may have a contact region forming a conductive contact layer in contact with one side of the power semiconductor device, i.e. the top side or the bottom side of the semiconductor chip or die. In order to provide a sufficiently large thermal capacity, the conductive contact layer in contact with the one side of the power semiconductor device may be relatively thick and may be made of material having a high specific thermal conductivity and/or a high specific thermal capacity. For example, in applications like an SSPC it has turned out advisable to provide the conductive contact layer in contact with the one side of the power semiconductor device with a thickness of at least 35 µm.

A suitable material for conductive contact layer in contact with the one side of the power semiconductor device is copper.

The thicker the conductive contact layer in contact with the one side of the power semiconductor device is, the larger is the thermal capacity provided and the more thermal energy may be taken up by the conductive contact layer without increasing temperature. As the conductive contact layer is in direct contact with the power semiconductor chip or die of the power semiconductor device over a large area, thermal conduction is very efficient. For this reason the conductive contact layer can take up thermal energy very quickly.

To improve thermal conduction, the substrate may be free of passages, cutouts, or breakthrough structures, at least in the region, or regions, where of the at least one first and second power semiconductor devices are located. This applies particularly, in any region where the at least one first and second conductive structures are located, particularly where the first and second conductive contact layers are contacting the substrate. In this way, thermal contact between the first and second conductive structures and the substrate is optimized and heat can be transported away via the substrate. The substrate may even include specific structures (e.g. layers) having very good thermal conductivity for efficient heat management.

Soldering may a technique for forming each of the at least one first and second conductive contact layers, while providing good heat capacity and transport of heat characteristics. Particularly, it has turned out suitable to form each of the at least one first and second conductive contact layers by vapor phase soldering or other wetflow soldering equipment. However, in order to achieve sufficiently good thermal characteristics any soldered structures should have a void content of 25% or less.

In addition to the first and second contact layers, each of the at least one first and second conductive structures may comprise at least one heavy wire bond for contacting the first and second power semiconductor devices to the top or bottom side of the substrate, respectively. The heavy wire bond may comprise at least one bond wire with a wire diameter of at least 100 µm, in particular of 300 to 500 µm.

The power semiconductor chip module may have further components, in particular SMD components and/or at least one wire fuse, attached to the top side of the substrate and/or to the bottom side of the substrate. These additional components may be included in a common globtop cover with the first and second semiconductor devices, respectively. The globtop cover is formed by an encapsulant for electrical insulation, which also provides for mechanical and chemical protection.

The substrate may comprise a plurality of power semiconductor devices attached to each side of the substrate. These power semiconductor devices may be embedded in a common cover or potting (e.g. a globtop), or may be embedded in separate covers or pottings (e.g. globtops).

In further embodiments, a solid state power controller may be provided comprising at least one power semiconductor module, preferably a plurality, of the power semiconductor modules, as described herein. The solid state power controller may comprise a printed circuit board and a plurality of power semiconductor chip modules attached to the printed circuit board. Any suitable number of the power semiconductor chip modules may be attached to the printed circuit board, e.g. via SMT or by inserting the power semiconductor modules into sockets which itself are mounted to the printed circuit board. In further embodiments of the solid state power controller a cooling structure may be mounted to the printed circuit board.

The invention claimed is:

1. A power semiconductor chip module, comprising
a printed circuit board having a top side and a bottom side, each of the top side and the bottom sides being provided with top and bottom contact pads;
at least one first power semiconductor device attached by chip-on-board technology to the top side of the printed circuit board in a leadless manner;
at least one first conductive structure thermally and electrically connecting the at least one first power semiconductor device to a respective one of the top contact pads on the top side of the printed circuit board;
at least one second power semiconductor device attached by chip-on-board technology to the bottom side of the printed circuit board in a leadless manner; and
at least one second conductive structure thermally and electrically connecting the at least one second power semiconductor device to a respective one of the bottom contact pads on the bottom side of the printed circuit board;
wherein the at least one first and the at least one second conductive structures comprise a respective first contact region and second contact region in contact with the printed circuit board, respectively, the first contact region having a first conductive contact layer in contact with an adjacent side of the at least one first semiconductor device and the top side of the printed circuit board, the second contact region having a second conductive contact layer in contact with an adjacent side of the at least one second power semiconductor device and the bottom side of the printed circuit board,
wherein each of the first and second conductive contact layers covers the area of the respective adjacent side of the at least one first and second power semiconductor device, and
wherein each of the first and second conductive contact layers is made of an electrically and thermally conductive material,
wherein each of the at least one first and second conductive structures comprises at least one heavy wire bond for contacting an opposite side of the first and second power semiconductor devices to the top or bottom side of the printed circuit board, respectively, the heavy wire bond comprising at least one bond wire with a wire diameter of 100 to 500 µm, and
wherein each of the first and second power semiconductor devices is embedded in a potting of electrically isolating material, each of the pottings having the configuration of a globtop.

2. The power semiconductor chip module according to claim 1, wherein the at least one first power semiconductor device and/or the at least one second power semiconductor device is provided as bare semiconductor die, particularly each of the first and second power semiconductor devices being provided as a bare semiconductor die.

3. The power semiconductor chip module according to claim 1, wherein each of the first and second power semiconductor devices has a current rating of at least 1 A.

4. The power semiconductor chip module according to claim 1, wherein each of the first and second power semiconductor devices has a voltage rating of at least 18V DC or AC.

5. The power semiconductor chip module according to claim 4, wherein each of the at least one first and second power semiconductor devices includes at least one of an insulated gate bipolar transistor power diode (IGBT), a metal-oxide semiconductor field effect transistor (MOSFET), a thyristor, a Schottky diode, a power diode, or combinations thereof, particularly made from SiC, GaN, or Si.

6. The power semiconductor chip module according to claim 1, wherein the printed circuit board is free of passages or cutouts in the region of the at least one first and second power semiconductor devices and/or in the region of the at least one first and second conductive structures.

7. The power semiconductor chip module according to claim 1, wherein each of the at least one first and the at least one second conductive structures has a thermal capacity sufficient to take up an amount of heat generated during a switching cycle of the at least one first power semiconductor device or the at least one second power semiconductor device, respectively, without increasing temperature above a critical threshold.

8. The power semiconductor chip module according to claim 1, wherein each of the first and second conductive contact layers is made of a metal or a metal alloy that includes at least one of copper, silver, gold, tin, or an alloy comprising any combination of copper, silver, gold, tin.

9. The power semiconductor chip module according to claim 8, wherein each of the at least one first and second conductive contact layers comprises a soldered structure formed by soldering, particularly by vapor phase soldering or other wetflow soldering equipment, the soldered structure having a void content of 25% or less.

10. The power semiconductor chip module according to 1, wherein the wire diameter of the at least one bond wire of the heavy wire bond is 300 to 500 µm.

11. The power semiconductor chip module according to claim 1, wherein further components, in particular SMD components and/or at least one wire connection, are attached to the top side of the printed circuit board and/or to the bottom side of the printed circuit board; wherein in particular the further components are embedded in a common globtop cover with the first and second semiconductor devices, respectively.

12. A solid state power controller comprising a plurality of the power semiconductor chip modules according to claim 1.

* * * * *